(12) United States Patent
Clark

(10) Patent No.: US 6,475,287 B1
(45) Date of Patent: Nov. 5, 2002

(54) ALIGNMENT DEVICE WHICH FACILITATES DEPOSITION OF ORGANIC MATERIAL THROUGH A DEPOSITION MASK

(75) Inventor: Thomas K. Clark, Walworth, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/893,250

(22) Filed: Jun. 27, 2001

(51) Int. Cl.[7] .............................................. C23C 16/00
(52) U.S. Cl. ....................... 118/721; 118/720; 118/504; 118/505
(58) Field of Search ................................ 118/720, 721, 118/504, 505

(56) References Cited

U.S. PATENT DOCUMENTS 6,146,489 A * 11/2000 Wirth .......................... 156/280

* cited by examiner

Primary Examiner—Jeffrie R. Lund
(74) Attorney, Agent, or Firm—Raymond L. Owens

(57) ABSTRACT

An alignment device for permitting a deposition mask to be positioned relative to a substrate to facilitate deposition of organic material on to the substrate which will be part of an organic light emitting device, including a base having a first set of alignment pins and a second set of alignment pins; a plate secured to the base; a frame having an opening aligned with the plate, the frame being formed with a first set of alignment pin receiving holes corresponding to the position of the first set of pins so that the frame is removably mounted to the base; the deposition mask and positioned on the plate; a transparent flat plate contacting the second set of pins and the deposition mask and being sized to expose portions of the deposition mask; and securing the exposed portions of the deposition mask to the frame.

6 Claims, 4 Drawing Sheets

ALIGNMENT DEVICE WHICH FACILITATES DEPOSITION OF ORGANIC MATERIAL THROUGH A DEPOSITION MASK

FIELD OF THE INVENTION

The present invention relates to the deposition of organic material through a mask onto a substrate in the process of making an organic light emitting diode (OLED).

BACKGROUND OF THE INVENTION

In making organic light emitting devices (OLED) there are a number of steps in which organic layers are deposited on or over a substrate. It is essential that a deposition mask be aligned and properly mounted so that accurate deposition takes place in the appropriate place. The deposition mask is typically a precision mask made of a magnetic material and is thin and malleable. The deposition mask is lithographically patterned and because it is thin permits the appropriate thickness of organic material to be deposited on or over the substrate. The deposition mask has to be properly mounted and then aligned to the substrate. The following is a description of a standard technique used to mount and align the deposition mask. Prior art typically uses a frame and manually centers the deposition mask relative to the frame. Typically, tape is used to secure the frame to the deposition mask. In this process, after the tape secures one edge to the deposition mask, the deposition mask is placed in tension and secured on its opposite edge by tape. The frame with the mounted deposition mask is then positioned in vacuum chamber relative to the substrate. An alignment camera is typically used to provide a fine scale positioning of the frame so that the deposition mask is properly aligned prior to deposition. This is a highly time consuming process. The process is subject to errors because there is a subjective judgement made during the visual alignment. Another problem is that during tensioning of the deposition mask, ripples can be formed in such deposition mask.

SUMMARY OF THE INVENTION

It is an object of the present invention to provide an improved way of accurately positioning a deposition mask on the surface of a substrate minimizing visual errors and rippling caused by tensioning.

This object is achieved by an alignment device for permitting a deposition mask to be positioned relative to a substrate to facilitate deposition of organic material on to the substrate which will be part of an organic light emitting device, comprising:

(a) a base having a first set of alignment pins and a second set of alignment pins;

(b) a plate secured to the base;

(c) a frame having an opening aligned with the plate, the frame being formed with a first set of alignment pin receiving holes corresponding to the position of the first set of pins so that the frame is removably mounted to the base;

(d) the deposition mask positioned on the plate;

(e) a transparent flat plate contacting the second set of pins and the deposition mask and being sized to expose portions of the deposition mask; and (f) means for securing the exposed portions of the deposition mask to the frame.

An advantage of the present invention is that the deposition mask can accurately be positioned in contact with the surface of the substrate preventing rippling of the deposition mask thereby providing improving the yield in making organic light emitting diodes. In one embodiment by providing magnets in the frame and magnetic material in the deposition mask, the alignment of the deposition mask on the frame can be closely spaced to the organic light emitting device.

DETAILED DESCRIPTION OF THE PREFERRED EMBODIMENTS

Figure 1:
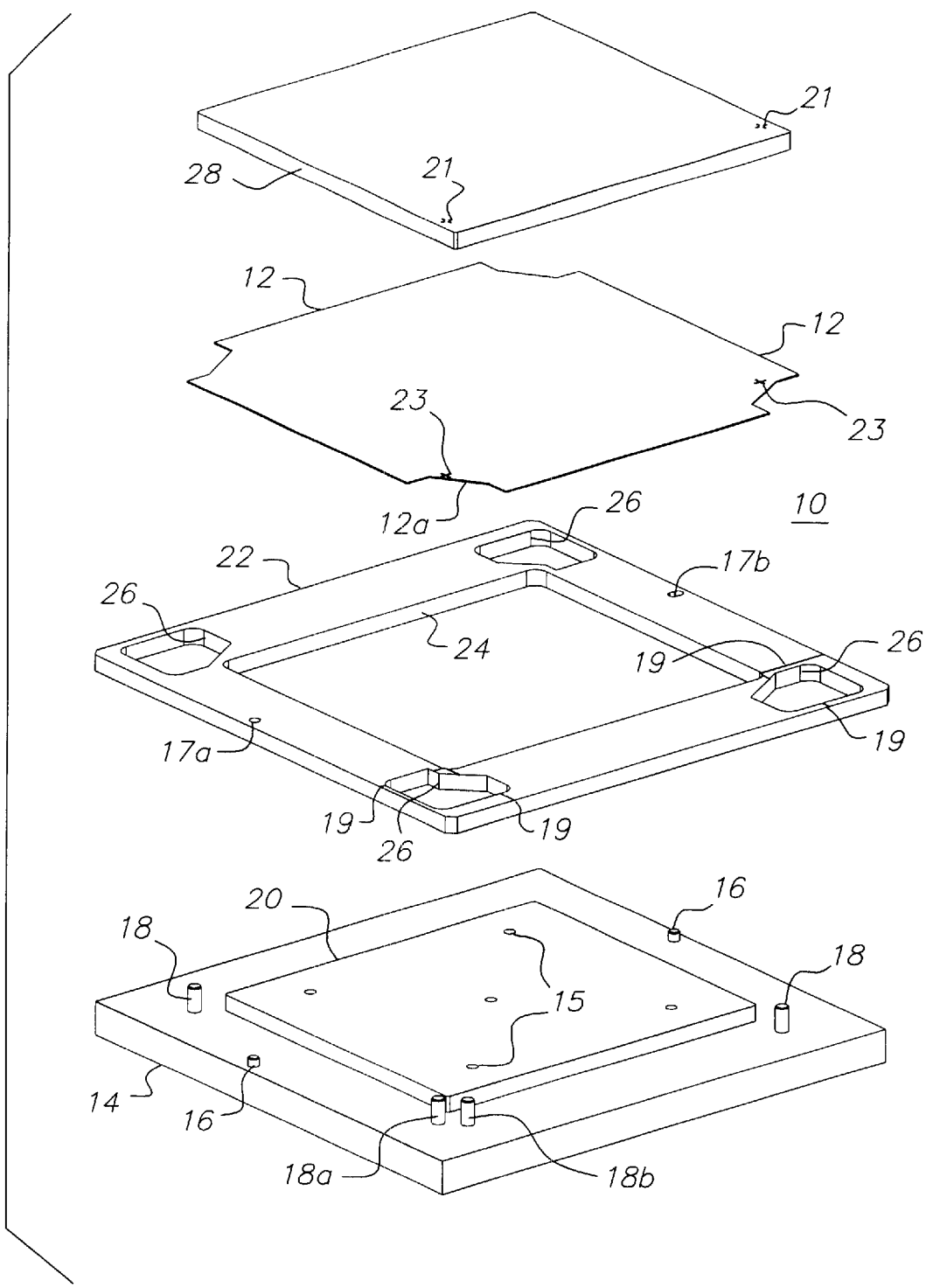
FIG. 1 is an exploded view of an alignment device for deposition mask in accordance with the present invention.

FIG. 1 depicts an exploded view of an alignment device 10 for a deposition mask 12. On the deposition mask 12 there are cutout portions 12a which are aligned with engraved alignment lines 19 on frame 22 when the disposition mask 12 is positioned. The alignment device 10 permits the deposition mask 12 to be positioned relative to a substrate of an OLED device to facilitate deposition. The alignment device 10 includes a base 14 having a first set of alignment pins 16 and a second set of alignment pins 18. The alignment pins 16 as shown include two pins disposed on opposite sides of the base 14. The base 14 is generally rectangular and the second set of alignment pins 18 are disposed in three corners of the base 14. As shown, in one of the corners there are two alignment pins 18a and 18b but in the remaining two corners there is a single alignment pin 18.

A plate 20 is secured to the base 14 by any convenient means. As shown, the plate 20 is fastened by screws to the base 14. Although the screws are not shown for convenience of illustration are depicted by holes 15. The plate 20 is preferably made of aluminum and provides a top flat surface on which the deposition mask 12 is to be positioned. A frame 22, generally rectangular in shape, has a central opening 24. Around each of the four corners of the frame 22 there are cutout portions 26. In three of the cutout portions 26, the alignment pins 18 project therethrough (see FIG. 2.)

The purpose of these cutout portions 26 is to facilitate positioning of the alignment device 10 in a vacuum chamber which permits the engagement of a mechanism in the vacuum chamber as well understood in the art. The frame 22 is removably mounted to the base 14 using alignment pins 16. The alignment pins 16 pass through holes 17a and 17b in the frame 22. The hole 17a has a circular 30 cross-section and hole1 7b has an oblong shape to permit proper alignment. A transparent flat plate 28 is positioned to contact the second set of alignment pins 18 and deposition mask 12 and is sized to expose edge portions of the deposition mask 12 when it is properly positioned. The transparent flat plate 28 includes fiducial marks 21 which are electroplated. The fiducial marks 21 are cross lines which are shown larger than they actually are. The fiducial marks 21 are used to permit a visual alignment with fiducial marks 23 on the deposition mask 12. The exposed portions of the deposition mask 12 is secured to the frame 22. It can be secured by adhesive or magnetic material.

Figure 2:
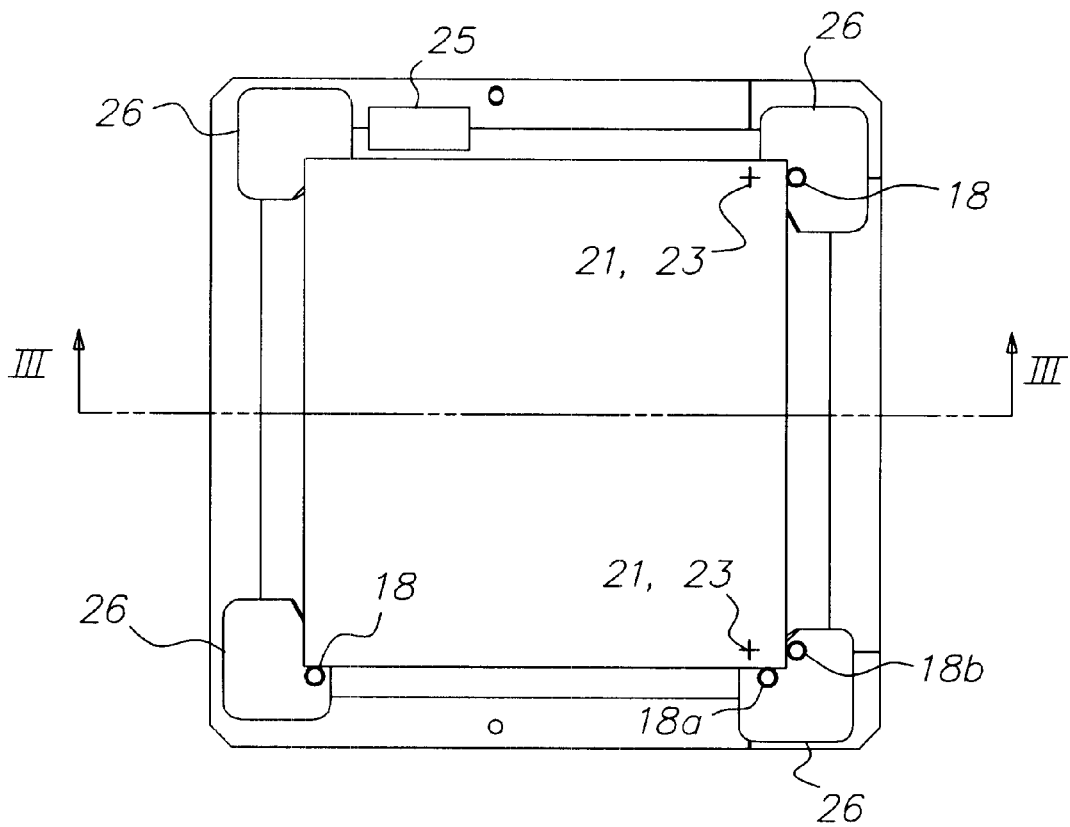
FIG. 2 is a top view the alignment device of FIG. 1.
Figure 3:
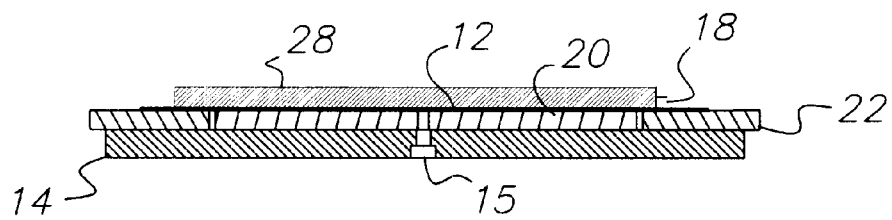
FIG. 3 is a cross-sectional view taken along lines 3—3 of FIG. 2.

Turning now to FIGS. 2 and 3 which respectively show a top view of the alignment device 10 and a cross-sectional view taken along lines 3—3. In particular with reference to FIG. 3, the base 14, plate 20, the deposition mask 12 and the transparent flat plate 28 are shown stacked one on top of the other. The frame 22 is shown to have the same width as plate 20. The pins 16 and 18 are not shown for clarity of illustration. One of the pins 18 is shown in its alignment position.

The alignment of the deposition mask 12 in the alignment device 10 will now be described. The frame 22 is mounted on base 14 using alignment pins 16. The alignment pins 16 are located on the base 14 in such a manner that frame 22 can be mounted in one orientation only. The frame 22 when mounted on base 14 is to be positioned in a manner that aligns plate 20 top surface is at the same identical height as frame 22. The deposition mask 12 is visually aligned on top of plate 20 and frame 22 using engraved alignment lines 19 on frame 22 for initial alignment as shown in FIG. 1. The transparent flat plate 28 is placed on top of deposition mask 12 and against alignment pins 18, 18a, and 18b. The deposition mask 12 is manually aligned using the electroplated fiducial 23 and corresponding fiducial 21 located on transparent flat plate 28. The relationship of transparent flat plate 28 and alignment pins 18,18a, and 18b must remain against the alignment pins 18a and 18b during the alignment process.

Deposition mask 12 is then attached to frame 22 using one of two methods. In the first method adhesive strips 25 secure the deposition mask 12 the frame 22. Only one of the adhesive strips 25 is shown although typically there will be two for each edge and they secure the deposition mask 12 to frame 22.

Figure 4:
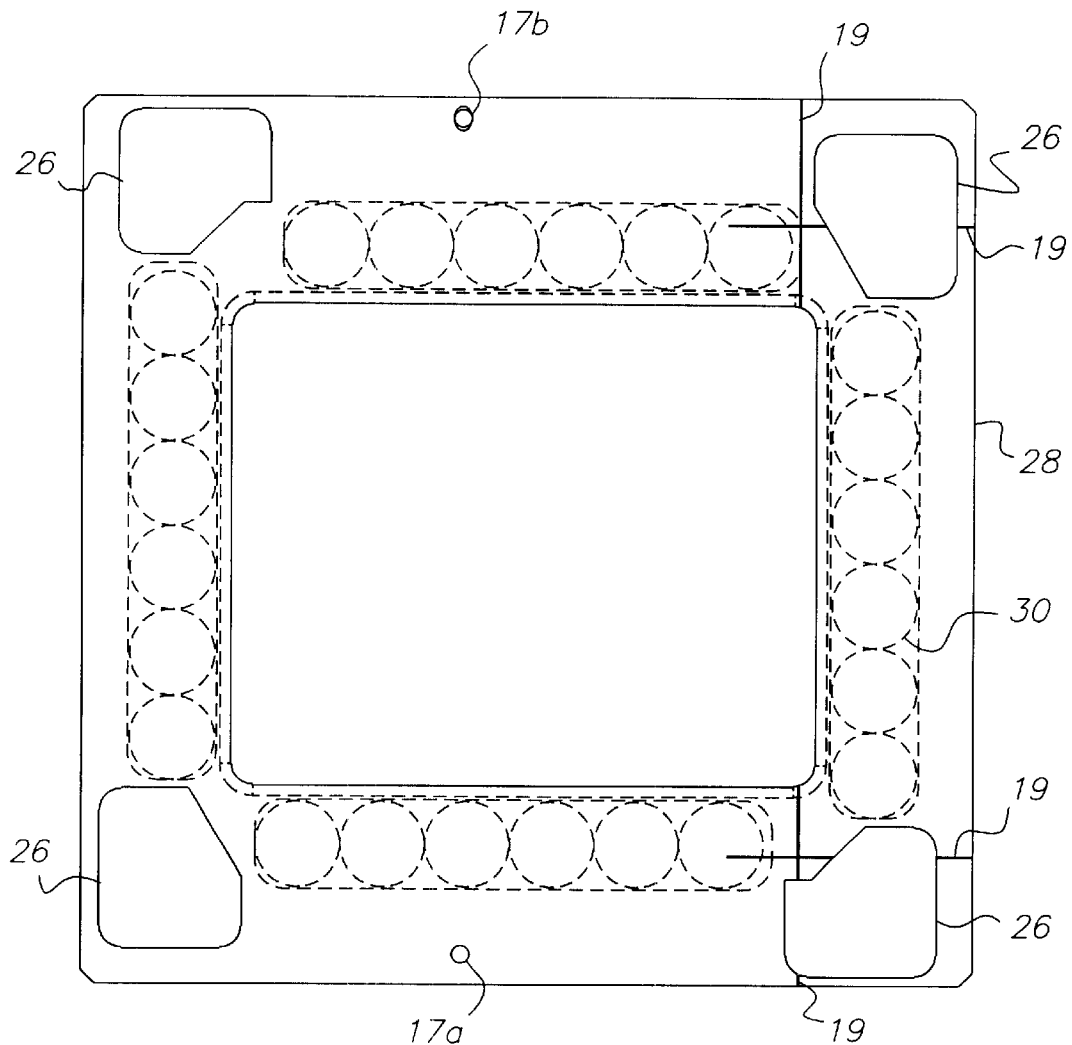
FIG. 4 depicts a frame of another embodiment of the invention which includes a plurality of magnets.

In the second method which is depicted in FIG. 4, the alignment device 10 is the same as in FIGS. 1–3 with the exception that a plurality of magnets 30 are deposed around the periphery of the frame 22. For convenience of illustration other portions of the frame have not been shown. In the second method, the deposition mask is made to include magnetic material for example ferrous metals such as nickel cobalt as well other materials. The amount of ferrous metals is such that the field exerted by the magnets 30 causes the deposition mask 12 to be secured to the frame 22 and held in a planar fashion. The second method is particularly suitable when it is not desirable to use adhesives. Both the first and second methods can however be simultaneously used in certain applications.

Figure 5:
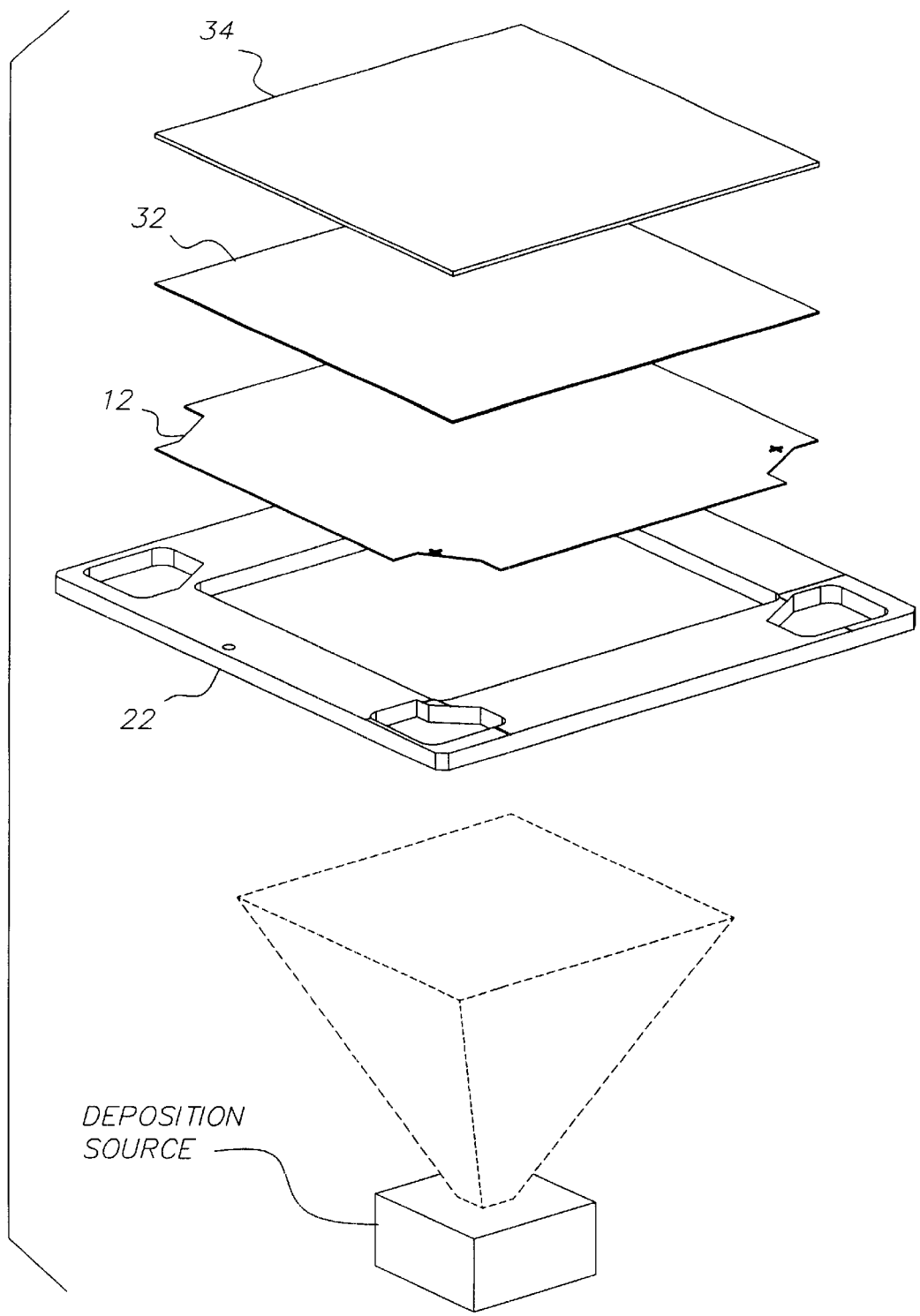
FIG. 5 is a schematic representation of the deposition of organic material onto a substrate of an OLED through the deposition mask which has been positioned relative to the substrate.

Turning now to FIG. 5, is a schematic representation of the deposition of organic material onto a substrate 32 of an OLED device through the deposition mask 12. After the alignment device 10 has been assembled with the deposition mask 12, the transparent flat plate 28 is removed. The assembled deposition mask 12 and frame 22 are removed from base 14. It is the assembled deposition mask 12 and frame 22 are placed in an evacuation chamber (not shown). The substrate 32 is positioned on the deposition mask 12. A flat plate magnet 34 is placed on the substrate 32 and exerts a magnetic field which pulls the deposition mask 12 into the substrate 32. At this point a deposition source applies heat to organic material which is evaporate and deposited through the deposition mask 12 onto the substrate 32.

The invention has been described in detail with particular reference to certain preferred embodiments thereof, but it will be understood that variations and modifications can be effected within the spirit and scope of the invention.

| PARTS LIST | |
|---|---|
| 10 | alignment device |
| 12 | deposition mask |
| 12a | cutout portions |
| 14 | base |
| 15 | holes |
| 16 | alignment pins |
| 17a | holes |
| 17b | holes |
| 18 | alignment pins |
| 18a | alignment pins |
| 18b | alignment pins |
| 19 | alignment |
| 20 | plate |
| 21 | fiducial marks |
| 22 | frame |
| 23 | fiducial marks |
| 24 | central opening |
| 25 | adhesive strips |
| 26 | cutout portions |
| 28 | transparent flat plate |
| 32 | substrate |
| 34 | flat plate magnet |

What is claimed is:

1. An alignment device for permitting a deposition mask to be positioned relative to a substrate to facilitate deposition of organic material on to the substrate which will be part of an organic light emitting device, comprising:

(a) a base having a first set of alignment pins and a second set of alignment pins;

(b) a plate secured to the base;

(c) a frame having an opening aligned with the plate, the frame being formed with a first set of alignment pin receiving holes corresponding to the position of the first set of pins so that the frame is removably mounted to the base;

(d) the deposition mask positioned on the plate;

(e) a transparent flat plate contacting the second set of pins and the deposition mask and being sized to expose portions of the deposition mask; and (f) means for securing the exposed portions of the deposition mask to the frame.

2. The device of claim 1 where in the first set of alignment pins include two spaced apart pins positioned to align the frame relative to the base and plate.

3. The devise of claim 2 where in the frame includes four spaced cut out portions and the second set of pins extend beyond the surface of the frame in three of the four cut out portions to engage the plate and wherein at least two of the pins of the second set of pins are positioned in one cut out portion to engage two separate edges of the plate.

4. The device of claim 3 wherein the frame includes alignment lines for positioning the edges of the deposition mask to properly align such deposition mask on the plate.

5. The device of claim 4 wherein the transparent plate and the mask include fiducial marks which also when aligned facilitate proper alignment of the mask to the frame.

6. The alignment device of claim 1 further including a plurality of magnets provided in the frame and wherein the deposition mask includes magnetic material.

* * * * *